United States Patent
Umezawa et al.

(10) Patent No.: US 12,087,688 B2
(45) Date of Patent: Sep. 10, 2024

(54) SEMICONDUCTOR STORAGE DEVICE

(71) Applicant: KIOXIA CORPORATION, Tokyo (JP)

(72) Inventors: Takaco Umezawa, Kamakura Kanagawa (JP); Hiroaki Yamamoto, Yokohama Kanagawa (JP); Shinichi Asou, Yokohama Kanagawa (JP); Tetsuya Tada, Yamato Kanagawa (JP); Katsuaki Mouri, Yokohama Kanagawa (JP); Takahiro Shimokawa, Yokohama Kanagawa (JP); Syunsuke Sasaki, Kamakura Kanagawa (JP)

(73) Assignee: Kioxia Corporation, Tokyo (JP)

( * ) Notice: Subject to any disclaimer, the term of this patent is extended or adjusted under 35 U.S.C. 154(b) by 380 days.

(21) Appl. No.: 17/458,051

(22) Filed: Aug. 26, 2021

(65) Prior Publication Data
US 2022/0189868 A1    Jun. 16, 2022

(30) Foreign Application Priority Data

Dec. 16, 2020    (JP) .................................. 2020-208594

(51) Int. Cl.
| | | |
|---|---|---|
| H01L 23/528 | (2006.01) | |
| H01L 23/522 | (2006.01) | |
| H10B 41/27 | (2023.01) | |
| H10B 43/27 | (2023.01) | |

(52) U.S. Cl.
CPC ........ H01L 23/528 (2013.01); H01L 23/5226 (2013.01); H10B 41/27 (2023.02); H10B 43/27 (2023.02)

(58) Field of Classification Search
CPC ............... H01L 23/528; H01L 27/0207; H01L 23/5226; G10B 41/27; H10B 43/27; H10B 43/10; G11C 16/0483; G11C 16/06; H04Q 2213/196; H03B 2202/082
See application file for complete search history.

(56) References Cited

U.S. PATENT DOCUMENTS

| | | | | |
|---|---|---|---|---|
| 4,796,224 A | * | 1/1989 | Kawai ................... | G11C 5/025 365/189.12 |
| 2011/0194349 A1 | | 8/2011 | Noda | |
| 2013/0062771 A1 | | 3/2013 | Kodama et al. | |
| 2017/0053054 A1 | * | 2/2017 | Vedantam ............. | G06F 30/394 |
| 2020/0295024 A1 | * | 9/2020 | Takahashi ............. | G11C 16/26 |
| 2022/0189868 A1 | * | 6/2022 | Umezawa ............. | H10B 43/10 |

FOREIGN PATENT DOCUMENTS

JP    2011181891 A    9/2011

* cited by examiner

*Primary Examiner* — Galina G Yushina
(74) *Attorney, Agent, or Firm* — Kim & Stewart LLP (57) ABSTRACT

A semiconductor storage device includes a first signal line extending in a first direction, and second signal line extending in the first direction and adjacent to the first signal line in a second direction orthogonal to the first direction. The first signal line includes a trunk wiring extending in the first direction, and one or more branch wirings branched from the trunk wiring and extending on one side toward the second signal line in the second direction.

11 Claims, 10 Drawing Sheets

Prior Art

FIG. 5

Prior Art

Prior Art

FIG. 12

SEMICONDUCTOR STORAGE DEVICE

CROSS-REFERENCE TO RELATED APPLICATION(S)

This application is based upon and claims the benefit of priority from Japanese Patent Application No. 2020-208594, filed Dec. 16, 2020, the entire contents of which are incorporated herein by reference.

FIELD

Embodiments described herein relate generally to a semiconductor storage device.

BACKGROUND

A NAND flash memory is known as a semiconductor storage device.

DETAILED DESCRIPTION

Embodiments provide a semiconductor storage device capable of improving noise suppression characteristics while preventing an increase in a chip area.

In general, according to one embodiment, a semiconductor storage device includes a first signal line extending in a first direction and a second signal line extending in the first direction. The second signal line is adjacent to the first signal line in a second direction orthogonal to the first direction. The first signal line includes a trunk wiring extending in the first direction, and one or more branch wirings branched from the trunk wiring and extending on one side toward the second signal line in the second direction.

Hereinafter, embodiments will be described with reference to the drawings.

First Embodiment (1. Configuration)
(1-1. Configuration of Memory System)

Figure 1:
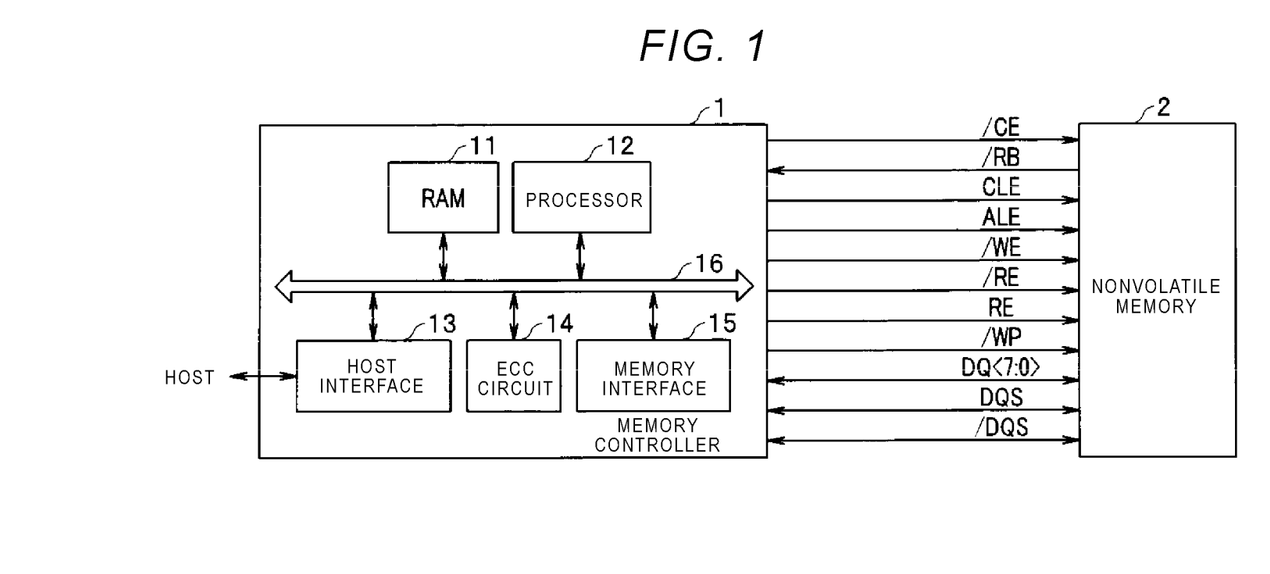
FIG. 1 is a block diagram showing a configuration example of a storage device according to an embodiment.

FIG. 1 is a block diagram showing a configuration example of a memory system according to an embodiment. The memory system according to the embodiment includes a memory controller 1 and a nonvolatile memory 2 as an example of a semiconductor storage device. The memory system may be connected to a host. The host is, for example, an electronic device such as a personal computer or a mobile terminal.

The nonvolatile memory 2 is a memory that stores data in a nonvolatile manner and is, for example, a NAND memory (NAND flash memory). The nonvolatile memory 2 is, for example, a NAND memory including memory cells capable of storing 3 bits per memory cell, that is, a NAND memory of 3 bit/Cell (TLC: Triple Level Cell). The nonvolatile memory 2 may also be a NAND memory of 1 bit/Cell, 2 bit/Cell, or 4 bit/Cell.

The memory controller 1 controls writing of data to the nonvolatile memory 2 in accordance with a write request from the host. In addition, the memory controller 1 controls reading of data from the nonvolatile memory 2 in accordance with a read request from the host. Transmission and reception of various signals such as a chip enable signal /CE, a ready and busy signal /RB, a command latch enable signal CLE, an address latch enable signal ALE, a write enable signal /WE, read enable signals RE, /RE, a write protect signal /WP, a signal DQ<7:0> as a data signal, and data strobe signals DQS and /DQS are performed between the memory controller 1 and the nonvolatile memory 2.

For example, each of the nonvolatile memory 2 and the memory controller 1 is formed as a semiconductor chip (hereinafter, also simply referred to as a "chip").

The chip enable signal /CE is a signal for enabling the nonvolatile memory 2. The ready and busy signal /RB is a signal for indicating whether the nonvolatile memory 2 is in a ready state (a state capable of receiving an instruction from the outside) or a busy state (a state not capable of receiving an instruction from the outside). The command latch enable signal CLE is a signal indicating that the signal DQ<7:0> is a command. The address latch enable signal ALE is a signal indicating that the signal DQ<7:0> is an address. The write enable signal /WE is a signal for indicating that the data signal is being input into the nonvolatile memory 2, and is asserted each time a command, an address, and data are received by the memory controller 1. While the signal /WE is at an "L (Low)" level, the nonvolatile memory 2 is instructed to take in the signal DQ<7:0>.

The read enable signals RE and /RE are signals indicating to the memory controller 1 that the data signal is to be read from the nonvolatile memory 2. For example, the read enable signals RE and /RE are used to control an operation timing of the nonvolatile memory 2 when the signal DQ<7:0> is output from the nonvolatile memory 2. The write protect signal /WP is a signal for instructing the nonvolatile memory 2 to prohibit data write and erase. The signal DQ<7:0> includes data transmitted and received between the nonvolatile memory 2 and the memory controller 1, and includes a command, an address, or data. The data strobe signals DQS and /DQS are signals for controlling an input and output timing of the signal DQ<7:0>.

The memory controller 1 includes a random access memory (RAM) 11, a processor 12, a host interface 13, an error check and correct (ECC) circuit 14, and a memory interface 15. The RAM 11, the processor 12, the host interface 13, the ECC circuit 14, and the memory interface 15 are connected to each other via an internal bus 16.

The host interface 13 outputs a request, user data (write data), or the like received from the host to the internal bus 16. The host interface 13 transmits the user data read from the nonvolatile memory 2, a response from the processor 12, or the like to the host.

The memory interface 15 controls the process of writing the user data, or the like into the nonvolatile memory 2 and the process of reading the user data, or the like from the nonvolatile memory 2 based on an instruction from the processor 12.

The processor 12 controls the memory controller 1. The processor 12 is, for example, a central processing unit (CPU), a micro processing unit (MPU), or the like. When the request is received from the host via the host interface 13, the processor 12 performs the control according to the request. For example, in response to the request from the host, the processor 12 instructs the memory interface 15 to write the user data and parity to the nonvolatile memory 2. Further, in response to the request from the host, the processor 12 instructs the memory interface 15 to read the user data and the parity from the nonvolatile memory 2.

The processor 12 determines a memory area in the nonvolatile memory 2 for storing the user data temporarily stored in the RAM 11. The user data is stored in the RAM 11 via the internal bus 16. The processor 12 determines the memory area for data (page data) in units of pages which are write units. In the present description, the user data stored in one page of the nonvolatile memory 2 is defined as unit data. The unit data is generally encoded by the ECC circuit 14 and stored in the nonvolatile memory 2 as a code word. In the present embodiment, encoding is optional. The memory controller 1 may store the unit data in the nonvolatile memory 2 without the encoding, but FIG. 1 shows a configuration in which the encoding is performed as a configuration example. When the memory controller 1 does not perform the encoding, the page data matches the unit data. One code word may be generated based on one piece of unit data, or one code word may be generated based on divided data obtained by dividing the unit data. Further, one code word may be generated using a plurality of pieces of unit data.

The processor 12 determines the memory area of the nonvolatile memory 2 as a write destination for each piece of unit data. A physical address is assigned to the memory area of the nonvolatile memory 2. The processor 12 manages the memory area of the write destination of the unit data by using the physical address. The processor 12 designates the determined memory area (indicated by the physical address) and instructs the memory interface 15 to write the user data to the nonvolatile memory 2. The processor 12 manages correspondence between a logical address (e.g., logical address managed by the host) and the physical address of the user data. When the processor 12 receives a read request including the logical address from the host, the processor 12 determines the physical address corresponding to the logical address, designates the physical address, and instructs the memory interface 15 to read the user data.

The ECC circuit 14 encodes the user data stored in the RAM 11 and generates the code word. The ECC circuit 14 also decodes the code word read from the nonvolatile memory 2.

The RAM 11 temporarily stores the user data received from the host until the user data is stored in the nonvolatile memory 2 or temporarily stores the data read from the nonvolatile memory 2 until the data is transmitted to the host. The RAM 11 is, for example, a general-purpose memory such as a static random access memory (SRAM) or a dynamic random access memory (DRAM).

FIG. 1 shows a configuration example in which the memory controller 1 includes the ECC circuit 14 and the memory interface 15. However, the ECC circuit 14 may be incorporated in the memory interface 15. Alternatively, the ECC circuit 14 may be incorporated in the nonvolatile memory 2.

When the write request is received from the host, the memory system operates as follows. The processor 12 temporarily stores data to be written in the RAM 11. The processor 12 reads the data stored in the RAM 11 and inputs the data to the ECC circuit 14. The ECC circuit 14 encodes the input data and inputs the code word to the memory interface 15. The memory interface 15 writes the received code word into the nonvolatile memory 2.

When the read request is received from the host, the memory system operates as follows. The memory interface 15 inputs the code word read from the nonvolatile memory 2 to the ECC circuit 14. The ECC circuit 14 decodes the received code word and stores the decoded data into the RAM 11. The processor 12 transmits the data stored in the RAM 11 to the host via the host interface 13.

(1-2. Configuration of Nonvolatile Memory)

Figure 2:
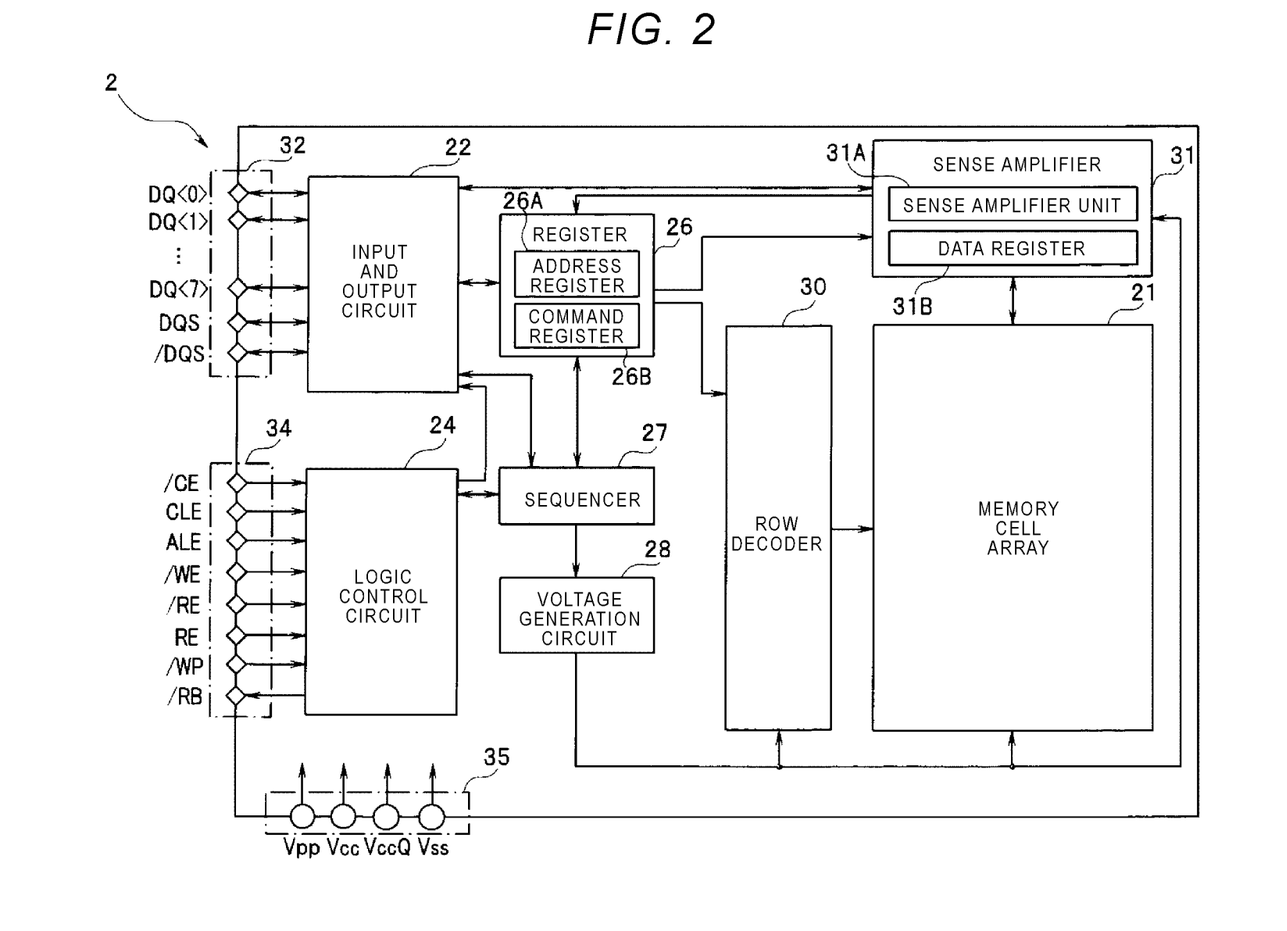
FIG. 2 is a block diagram showing a configuration example of a nonvolatile memory according to the embodiment.

FIG. 2 is a block diagram showing a configuration example of the nonvolatile memory of the embodiment. The nonvolatile memory 2 includes a memory cell array 21, an input and output circuit 22, a logic control circuit 24, a register 26, a sequencer 27, a voltage generation circuit 28, a row decoder 30, a sense amplifier 31, an input and output pad group 32, a logic control pad group 34, and a power supply input terminal group 35.

The memory cell array 21 includes a plurality of nonvolatile memory cells (not shown) associated with word lines and bit lines.

The input and output circuit 22 transmits and receives the signal DQ<7:0> and the data strobe signals DQS and /DQS to and from the memory controller 1. The input and output circuit 22 transmits the command and the address in the signal DQ<7:0> to the register 26. The input and output circuit 22 transmits and receives the write data and the read data to and from the sense amplifier 31.

The logic control circuit 24 receives the chip enable signal /CE, the command latch enable signal CLE, the address latch enable signal ALE, the write enable signal /WE, the read enable signals RE, /RE, and the write protect signal /WP from the memory controller 1. In addition, the logic control circuit 24 transmits the ready and busy signal /RB to the memory controller 1, and notifies the outside of the state of the nonvolatile memory 2.

The register 26 includes an address register 26A and a command register 26B. The address register 26A stores address information that is received from the memory controller 1 by the nonvolatile memory 2. The address information includes, for example, a block address, a page address, and a column address. The block address is used to select a block. The page address is used to select the word lines. The column address is used to select the bit lines. The command register 26B stores the command that is received from the memory controller 1 by the nonvolatile memory 2. The command includes, for example, a read command for causing the sequencer 27 to execute a read operation, a write command for causing the sequencer 27 to execute a write operation, an erase command for causing the sequencer 27 to execute an erase operation, or the like.

The sequencer 27 receives the command from the command register 26B, and performs overall control of the nonvolatile memory 2 in accordance with a sequence based on the command.

The voltage generation circuit 28 generates, based on an instruction from the sequencer 27, voltages necessary for operations such as writing, reading, and erasing of the data.

A row decoder 30 receives the block address and a row address in the address from the address register 26A, selects a corresponding block based on the block address, and selects a corresponding word line based on the row address. In addition, the row decoder 30 transmits the voltages necessary for the operations such as the writing, the reading, and the erasing of the data to the memory cell array 21.

The sense amplifier 31 includes a sense amplifier unit 31A and a data register 31B. When the data is read, the sense amplifier unit 31A detects and amplifies the data read from the memory cell to the bit line. When the data is written, the sense amplifier unit 31A transmits the write data via the bit line to the memory cell. When the data is read, the data register 31B temporarily stores the data received from the sense amplifier unit 31A and transmits the data to the input and output circuit 22. When the data is written, the data register 31B temporarily stores the data received from the input and output circuit 22 and transmits the data to the sense amplifier unit 31A.

The input and output pad group 32 includes a plurality of terminals (pads) corresponding to the signal DQ<7:0> and the data strobe signals DQS and /DQS in order to transmit and receive the signals including the data to and from the memory controller 1.

The logic control pad group 34 includes a plurality of terminals (pads) corresponding to the chip enable signal /CE, the command latch enable signal CLE, the address latch enable signal ALE, the write enable signal /WE, the read enable signals RE, /RE, and the write protect signal /WP in order to transmit and receive each signal to and from the memory controller 1.

The power supply input terminal group 35 includes a plurality of terminals to which power supply voltages Vcc, VccQ, and Vpp and a ground voltage Vss are input in order to supply various operation power supplies from the outside to the nonvolatile memory 2. The power supply voltage Vcc is a circuit power supply voltage which is generally supplied from the outside as the operation power supply, and, for example, a voltage of about 3.3 V is input. For example, a voltage of 1.2 V is input as the power supply voltage VccQ. The power supply voltage VccQ is used to transmit and receive the signals between the memory controller 1 and the nonvolatile memory 2. With an increase in an operating speed, a plurality of power supply pads dedicated to input and output terminals are disposed in the vicinity of the input and output pad group 32 for the terminals to which the power supply voltage VccQ and the ground voltage Vss.

The power supply voltage Vpp is a power supply voltage higher than the power supply voltage Vcc, and, for example, a voltage of 12 V is input. When the data is written to the memory cell array 21 or the data is erased, a high voltage of about 20V is required. At this time, a desired voltage can be generated at a high speed and with low power consumption by boosting the power supply voltage Vpp of about 12 V rather than boosting the power supply voltage Vcc of about 3.3 V by a booster circuit of the voltage generation circuit 28. On the other hand, for example, when the nonvolatile memory 2 is used in an environment where a high voltage cannot be supplied, a voltage may not be supplied to the power supply voltage Vpp. Even when the power supply voltage Vpp is not supplied, the nonvolatile memory 2 can perform various operations as long as the power supply voltage Vcc is supplied. That is, the power supply voltage Vcc is a power supply which is supplied to the nonvolatile memory 2 as standard, and the power supply voltage Vpp is, for example, a power supply that is additionally and optionally supplied to the nonvolatile memory 2 according to a usage environment.

(1-3. Cross-Sectional Structure of Nonvolatile Memory)

Figure 3:
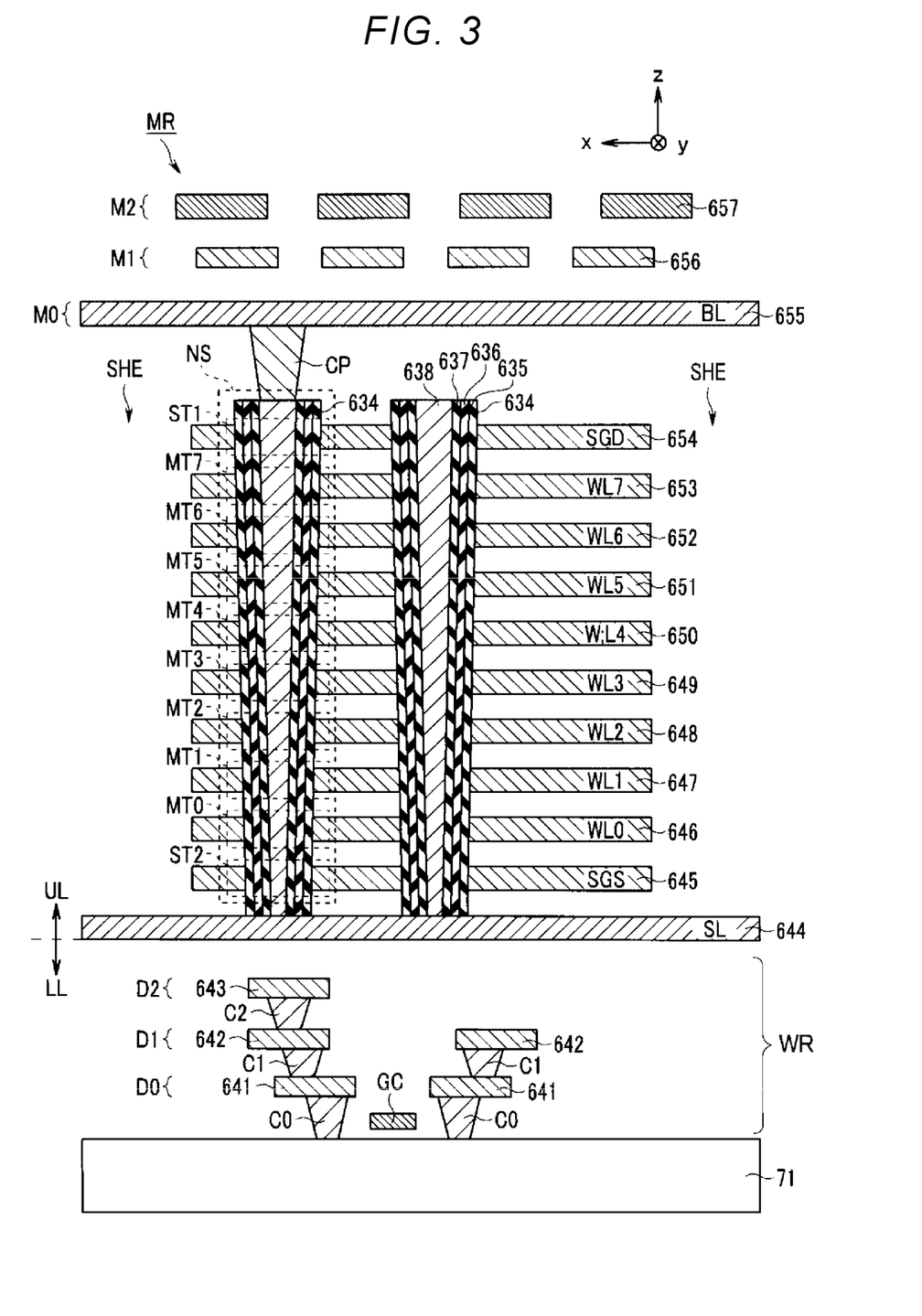
FIG. 3 is a cross-sectional view of a partial region of the semiconductor storage device according to the embodiment.

FIG. 3 is a cross-sectional view of a partial region of the semiconductor storage device according to the embodiment. FIG. 3 shows the semiconductor storage device having a structure in which a peripheral circuit region is formed on a semiconductor substrate 71 and the memory area is formed on an upper layer of the peripheral circuit region. In the following description, two horizontal directions orthogonal to a surface of the semiconductor substrate 71 are defined as an x direction and a y direction, and a direction perpendicular to the surface of the semiconductor substrate 71 is defined as a z direction.

As shown in FIG. 3, in a memory region MR, the nonvolatile memory includes the semiconductor substrate 71, conductors 641 to 657, memory holes 634, and contact plugs C0, C1, C2, and CP. In the drawings to be described below, a p-type or n-type well region formed in an upper surface portion of the semiconductor substrate 71, an impurity diffusion region formed in each well region, and an element isolation region insulating the well regions from each other are not shown.

In the memory region MR, for example, a plurality of contacts C0 are provided on the semiconductor substrate 71. The plurality of contacts C0 are connected to the impurity diffusion region (not shown) provided on the semiconductor substrate 71. The memory cell array of the NAND memory is disposed on the semiconductor substrate 71 via a wiring layer region WR. A peripheral circuit such as the input and output circuit is also formed in the wiring layer region WR.

The conductor 641 that forms a wiring pattern is provided on each contact C0. A part of a plurality of wiring patterns of the conductors 641 is a part of the above bit line BL. Another part of the plurality of wiring patterns is a part of wiring of various transistors. In that case, a gate electrode GC is provided in the vicinity of a region between adjacent conductors 641, and in this case, one of the adjacent conductors 641 is connected to a drain of the transistor, and the other conductor 641 is connected to a source of the transistor.

The contact C1, for example, is provided on each conductor 641. The conductor 642, for example, is provided on each contact C1. The contact C2, for example, is provided on the conductor 642. The conductor 643, for example, is provided on the contact C2.

Each of the wiring patterns of the conductors 641, 642, 643 are disposed in the wiring layer region WR between a sense amplifier circuit and the memory cell array (not shown). Hereinafter, wiring layers provided with the conductors 641, 642, and 643 are referred to as wiring layers D0, D1, and D2, respectively. The wiring layers D0, D1, and D2 are provided in a lower layer portion of the nonvolatile memory 2. Here, although three wiring layers are provided in the wiring layer region WR, two or less wiring layers or four or more wiring layers may be provided in the wiring layer region WR.

The conductor 644 is provided above the conductor 643, for example, via an interlayer insulating film. The conductor 644 is, for example, a source line SL formed in a plate shape parallel to an xy plane. Above the conductor 644, for example, the conductors 645 to 654 are stacked in this order corresponding to NAND strings NS. An interlayer insulating film (not shown) is provided between adjacent conductors in the z direction among the conductors.

A structure (a plurality of NAND strings NS) corresponding to one string unit SU is provided between adjacent slits SHE. The slit SHE extends in the y direction and the z direction, for example, and insulates the conductors 645 to 654 provided in an adjacent string unit SU (not shown).

Each of the conductors 645 to 654 is formed in a plate shape parallel to the xy plane, for example. For example, the conductor 645 corresponds to a select gate line SGS, the conductors 646 to 653 correspond to word lines WL0 to WL7, respectively, and the conductor 654 corresponds to a select gate line SGD.

Each memory hole 634 is provided in a columnar shape penetrating each of the conductors 645 to 654, and is in contact with the conductor 644. In the memory hole 634, for example, a block insulating film 635, a charge storage film 636, and a gate insulating film 637 are sequentially formed, and a conductive pillar 638 is further embedded in the memory hole 634.

For example, a portion where the memory hole 634 and the conductor 645 intersect each other functions as a select transistor ST2. A portion where the memory hole 634 and each of the conductors 646 to 653 intersect each other functions as a memory cell transistor (memory cell) MT. A portion where the memory hole 634 and the conductor 654 intersect each other functions as a select transistor ST1.

The conductor 655 is provided on a layer above an upper surface of the memory hole 634 via an interlayer insulating film. The conductor 655 is formed in a line shape extending in the x direction and corresponds to the bit line BL. A plurality of conductors 655 are arranged at intervals in the y direction (not shown). The conductor 655 is electrically connected to the conductive pillar 638 in one memory hole 634 corresponding to each string unit SU.

Specifically, in each string unit SU, for example, the contact plug CP is provided on the conductive pillar 638 in each memory hole 634, and one conductor 655 is provided on the contact plug CP. The present disclosure is not limited to such a configuration, and the conductive pillar 638 in the memory hole 634 and the conductor 655 may be connected to each other via a plurality of contacts, wirings, or the like.

The conductor 656 is provided on a layer above the layer, where the conductor 655 is provided, via an interlayer insulating film. The conductor 657 is provided on a layer above the layer, where the conductor 656 is provided, via an interlayer insulating film.

The conductors 656 and 657 correspond to, for example, a wiring provided in the memory cell array and a wiring for coupling the peripheral circuit provided under the memory cell array. The conductors 656 and 657 may be connected by a column-shaped contact (not shown). Here, the layer where the conductor 655 is provided is referred to as a wiring layer M0, the layer where the conductor 656 is provided is referred to as a wiring layer M1, and the layer where the conductor 657 is provided is referred to as a wiring layer M2.

As shown in FIG. 3, in the semiconductor storage device of the embodiment, the wiring layers D0, D1, and D2 are formed on a layer lower than the string unit SU. In addition, the wiring layers M0, M1, and M2 are formed on a layer higher than the string unit SU. The wiring layers D0, D1, and D2 are, for example, tungsten wirings formed by a damascene method.

The wiring layer M2 is an aluminum wiring formed by anisotropic etching such as, for example, reactive ion etching (RIE). Since the wiring layer M2 has a large film thickness and has a low resistance, power supply trunk wirings (Vcc, Vss) are allocated therein. The wiring layer M1 is, for example, a copper (Cu) wiring formed by the damascene method. Since the Cu wiring has high wiring reliability such as electromigration (EM) resistance, a signal line that needs to reliably transmit the data is allocated in the wiring layer M1. The wiring layer M0 is, for example, a Cu wiring formed by the damascene method. In addition to being used as the bit line BL, a part of the power supply trunk wirings is also allocated in wiring layer M0 for the purpose of strengthening the power supply. In general, an upper wiring layer (for example, the wiring layer M2) has larger thickness as compared with a lower wiring layer (for example, the wiring layer M1). Therefore, the wiring of the upper wiring layer (M2) has a lower resistance than the wiring of the lower wiring layer (M1). Not only the power supply trunk wiring, but also another line, such as a signal line, may be formed by using a higher wiring layer as much as possible.

(2. Layout)

(2-1. Layout of Signal Line)

Figure 4:
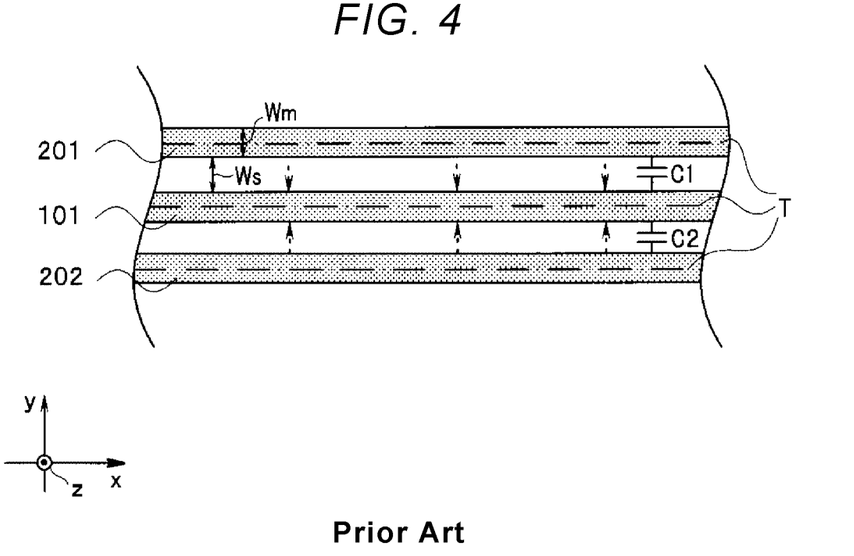
FIG. 4 is a schematic layout diagram of a wiring according to a comparative example.
Figure 5:
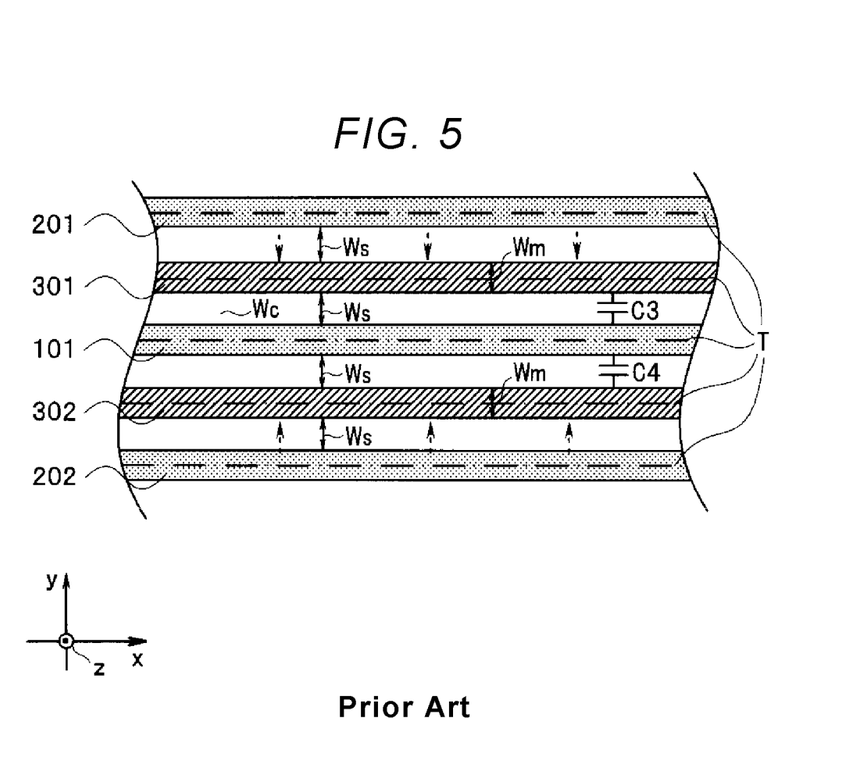
FIG. 5 is a schematic layout diagram of a wiring according to another comparative example.

Layouts of signal lines of comparative examples will be described first with reference to FIGS. 4 and 5. FIGS. 4 and 5 are schematic layout diagrams of wirings according to comparative examples.

As shown in FIG. 4, a signal line 101 extending in the x direction is disposed in the wiring layer M2. The signal line 101 is a wiring used for data transmission and reception, and is, for example, a bus wiring that connects the input and output circuit 22 and the data register 31B of the sense amplifier 31. In the wiring layer M2, a signal line 201 extending in the x direction is spaced from the signal line 101 in the +y direction (depicted as being above the signal line 101 in FIG. 4). Further, in the wiring layer M2, a signal line 202 extending in the x direction is spaced from the signal line 101 in the −y direction (depicted as being below the signal line 101 in FIG. 4). The signal lines 201 and 202 are, for example, wirings used for transmitting a clock signal, and are, for example, wirings that transmit and receive a control signal of the input and output circuit 22 or the sense amplifier 31.

Each of the signal lines 101, 201, and 202 is a signal line having a width Wm. The signal lines 101, 201, and 202 are disposed in adjacent wiring tracks T. The wiring track T is a reference line along which the wiring is to be disposed. (In each figure shown below, the wiring track T is indicated by an alternate long and short dash line.) By arranging a center line of a wiring to be disposed along the wiring track T, a minimum distance between wirings specified in a design rule is satisfied. For example, in the comparative examples shown in FIGS. 4 and 5, the wiring track T is set at an interval of a width (Wm+Ws). That is, a wiring interval between the signal line 101 and the signal line 201 which are disposed in adjacent wiring tracks T is the width Ws. Similarly, a wiring interval between the signal line 101 and the signal line 202 which are disposed in adjacent wiring tracks T is also the width Ws.

In the comparative example shown in FIG. 4, an inter-wiring coupling parasitic capacitance C1 exists between the signal line 101 and the signal line 201. Further, an inter-wiring coupling parasitic capacitance C2 exists between the signal line 101 and the signal line 202. When an interval between the wiring tracks T is set to be narrow, a fluctuation (voltage fluctuation) of a signal transmitted through the signal lines 201 and 202 propagates to the signal line 101 via the inter-wiring coupling parasitic capacitances C1 and C2. As a result, noise (crosstalk noise) is applied to the signal transmitted through the signal line 101, and the semiconductor storage device may malfunction.

In order to eliminate the influence of the crosstalk noise caused by the signal lines 201 and 202, it is common to use a wiring layout as shown in the comparative example of FIG. 5. That is, a wiring that transmits a signal with a small voltage amplitude, a wiring that supplies various power supply voltages, a wiring that supplies the ground voltage Vss, or the like are disposed, as shield wirings, between the signal line 101 which is to be protected from the crosstalk noise and the signal lines 201 and 202 which are noise sources. That is, as shown in FIG. 5, Vss voltage supply lines 301 and 302 are disposed on wiring tracks T adjacent to the signal line 101. The signal line 201 is disposed on the wiring track T adjacent to the Vss voltage supply line 301, and not the signal line 101. Further, the signal line 202 is disposed on the wiring track T adjacent to the Vss voltage supply line 302 and not the signal line 101. That is, the wirings are arranged in an order of the signal line 202, the Vss voltage supply line 302, the signal line 101, the Vss voltage supply line 301, and the signal line 201 along the y direction from the lower side in FIG. 5.

An inter-wiring coupling parasitic capacitance C3 exists between the signal line 101 and the Vss voltage supply line 301. In addition, an inter-wiring coupling parasitic capacitance C4 exists between the signal line 101 and the Vss voltage supply line 302. Since the Vss voltage supply lines 301 and 302 are the wirings that supply a constant voltage (ground voltage Vss), the crosstalk noise affecting the signal line 101 via the inter-wiring coupling parasitic capacitances C3 and C4 can be prevented.

In the layout shown in FIG. 4, three signal lines 101, 201, and 202 are arranged using three wiring tracks T. On the other hand, in the layout shown in FIG. 5, similarly, the three signal lines 101, 201, and 202 are arranged using five wiring tracks T. That is, in order to prevent the crosstalk noise, it is necessary to increase a wiring region with a width (2Wm+2Ws) in the y direction.

Figure 6A:
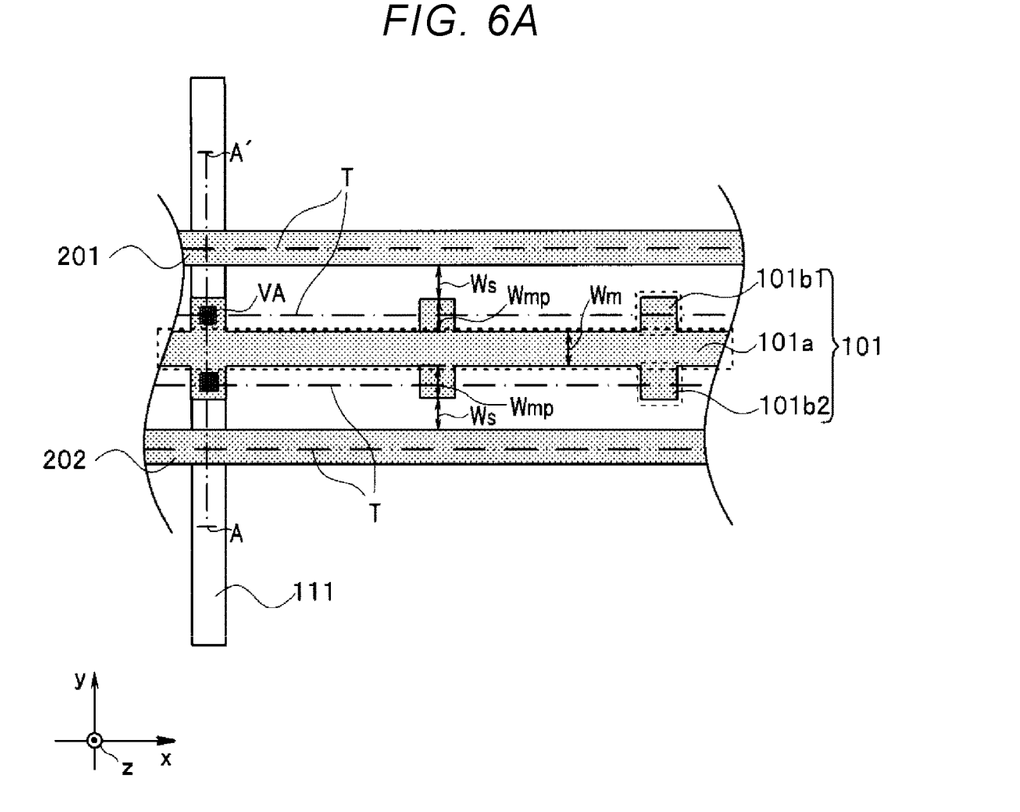
FIG. 6A is a schematic layout diagram of a wiring according to a first embodiment.
Figure 6B:
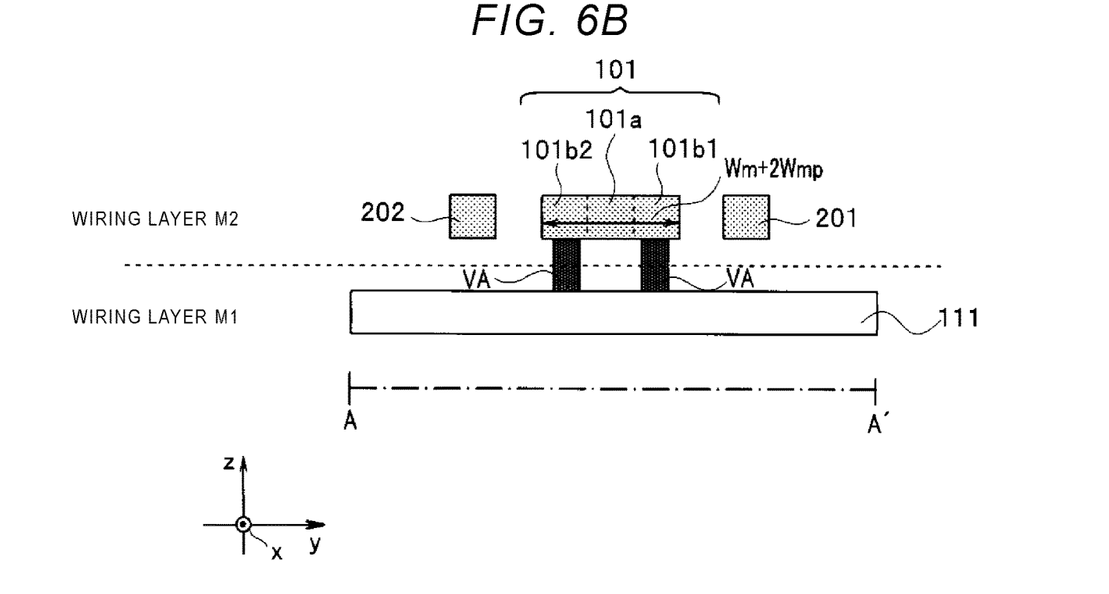
FIG. 6B is a cross-sectional view taken along line A-A' of FIG. 6A.

Next, a layout of the signal line according to the present embodiment will be described with reference to FIG. 6A and FIG. 6B. FIG. 6A is a schematic layout diagram of a wiring according to a first embodiment. That is, FIG. 6A is a schematic layout diagram of the wiring layers M2 and M1 in the xy plane as viewed from the z direction. FIG. 6B is a cross-sectional view taken along line A-A' of FIG. 6A. As shown in FIG. 6A, the signal line 101 extending in the x direction is disposed in the wiring layer M2. In the wiring layer M2, the signal line 201 extending in the x direction is spaced from the signal line 101 in the +y direction. Further, in the wiring layer M2, the signal line 202 extending in the x direction is spaced from the signal line 101 in the −y direction.

The signal line 101 includes a trunk wiring 101a extending in the x direction and branch wirings 101b1 and 101b2 branched from the trunk wiring 101a. The branch wiring 101b1 branches from the trunk wiring 101a and protrudes upward in the y direction. The branch wiring 101b2 branches from the trunk wiring 101b and protrudes downward in the y direction. The branch wiring 101b1 and the branch wiring 101b2 branch from the same position of the trunk wiring 101a. That is, the signal line 101 is formed in line symmetry with respect to an axis passing through a center of the trunk wiring 101a in the y direction and extending in the x direction. A length of the branch wiring 101b1 in the y direction is Wmp. A distance from an upper end of the branch wiring 101b1 in the y direction to the signal line 201 is Ws. A length of the branch wiring 101b2 in the y direction is Wmp. A distance from a lower end of the branch wiring 101b2 in the y direction to the signal line 202 is Ws.

By forming the signal line 101 in this manner, a wiring interval between the signal line 101 and the signal line 201 is Ws+Wmp. That is, as compared with the layout of the comparative example, the distance between the signal line 101 and the signal line 201 can be increased by the length of the branch wiring 101b1 in the y direction. Therefore, since the inter-wiring coupling parasitic capacitance C1 can be reduced, the crosstalk noise from the signal line 201 to the signal line 101 can be reduced. A wiring interval between the signal line 101 and the signal line 202 is also Ws+Wmp. That is, as compared with the layout of the comparative example, the distance between the signal line 101 and the signal line 202 can be increased by the length of the branch wiring 101b2 in the y direction. Therefore, since the inter-wiring coupling parasitic capacitance C2 can be reduced, the crosstalk noise from the signal line 202 to the signal line 101 can be reduced.

In the wiring layout shown in FIG. 6A, the length Wmp of the branch wirings 101b1 and 101b2 in the y direction is half the width of the wiring track T. That is, by setting the length Wmp of the branch wirings 101b1 and 101b2 to (Wm+Ws)/2, the three signal lines 101, 201, and 202 can be disposed using four wiring tracks T. Therefore, as compared with the layout of the comparative example shown in FIG. 5, the wiring region for one wiring track can be reduced in the y direction. That is, an area of the wiring region can be reduced as compared with a case of using a shield wiring while reducing the crosstalk noise.

As shown in FIG. 6A, when a signal line 111 extending in the y direction is disposed in the wiring layer M1 and the signal line 101 and the signal line 111 are connected by a via VA, the signal line 101 and the signal line 111 can be connected using a plurality of vias VAs by providing the via VA in each of the branch wirings 101b1 and 101b2. That is, as shown in the cross-sectional view of FIG. 6B, in a cross section of the signal line 111 taken along the line A-A', the signal line 101 has a length of (Wm+2Wmp) in the y direction. Specifically, the branch wirings 101b1 and 101b2 each having a length of Wmp extend from both sides of the trunk wiring 101a having a length of Wm. Since each of the branch wiring 101b1 and the branch wiring 101b2 can be provided with one via VA, the signal line 101 and the signal line 111 can be connected by two vias VAs. That is, when a cross wiring (signal line 111) which is provided in a wiring layer different from the wiring layer in which the signal line 101 is disposed, and which extends in a direction (y direction) orthogonal to an extending direction (x direction) of the signal line 101, and the signal line 101 are connected by the via VA, the cross wiring and the signal line 101 can be connected using a plurality of vias VAs.

Many plasma processes such as etching, ashing, ion implantation, and plasma chemical vapor deposition (CVD) are used for manufacturing a thin film device such as a semiconductor integrated circuit. In such a plasma process, there is a problem in breakdown or damage of a gate insulating film due to a charge-up phenomenon. A plasma damage occurs when charged particles in a plasma are captured by a conductor (for example, metal wiring) exposed in the plasma and the captured charges reach a gate electrode of a transistor. For example, in an etching process of forming a signal wiring, the signal wiring may act as an antenna that captures the charge from the plasma. A charge current generated due to charges captured by the signal wiring concentrates on the gate insulating film via the gate electrode, and damages the gate insulating film.

According to the layout of the embodiment, by providing the branch wiring, the number of vias VAs with respect to a wiring area can be increased. As a result, the plasma damage caused by the antenna effect can be alleviated, and thus it is possible to improve resistance to damage.

As described above, in the present embodiment, the signal line 101 includes the trunk wiring 101a extending in the x direction and the branch wiring 101b branched from the trunk wiring 101a. Then, the signal lines 201 and 202 are respectively disposed at positions separated from ends of the branch wirings 101b1 and 101b2 by the width Ws. Therefore, the distance between the signal line 101 (trunk wiring 101a) and the signal lines 201 and 202 can be increased by the length of the branch wirings 101b1 and 101b2. Therefore, the crosstalk noise from the signal lines 201 and 202 to the signal line 101 can be reduced while preventing an increase in the wiring area. That is, the noise resistance can be improved while preventing an increase in the chip area. Further, by providing the vias VAs for the branch wirings 101b1 and 101b2, the cross wiring disposed in another wiring layer and the signal line can be connected by the plurality of vias VAs, so that connectivity between the wirings is improved. Further, by connecting the wirings using a plurality of vias VAs, the resistance to the damage caused by the antenna effect can be improved.

Further, the branch wiring 101b may also be used as a pad for contact with a probe for measurement during an evaluation analysis.

Figure 7:
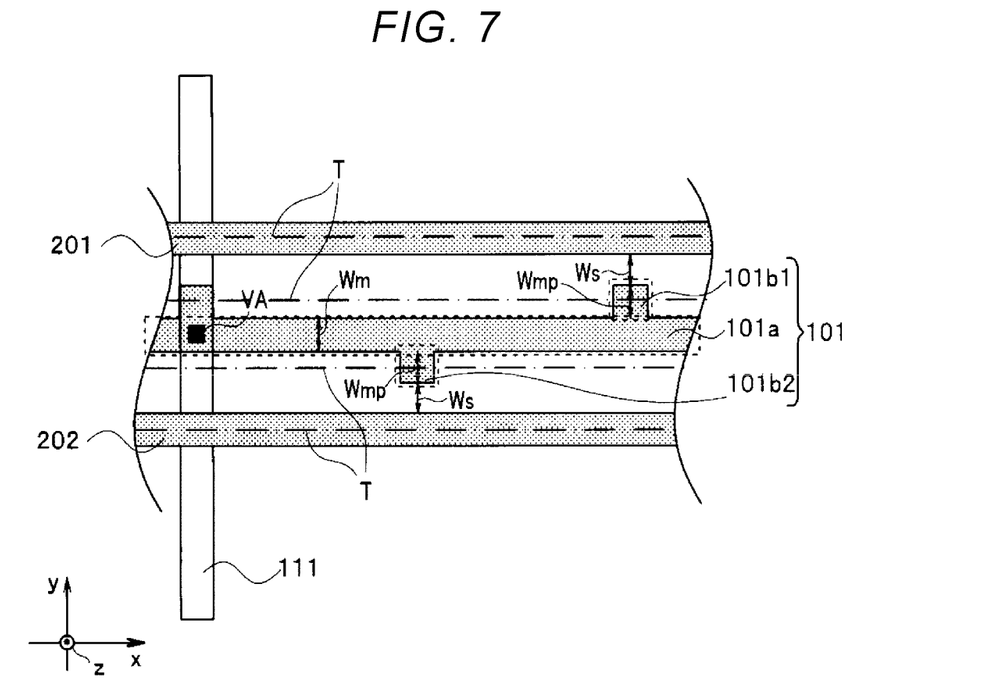
FIG. 7 is a schematic layout diagram of a wiring according to a first modification of the first embodiment.
Figure 8:
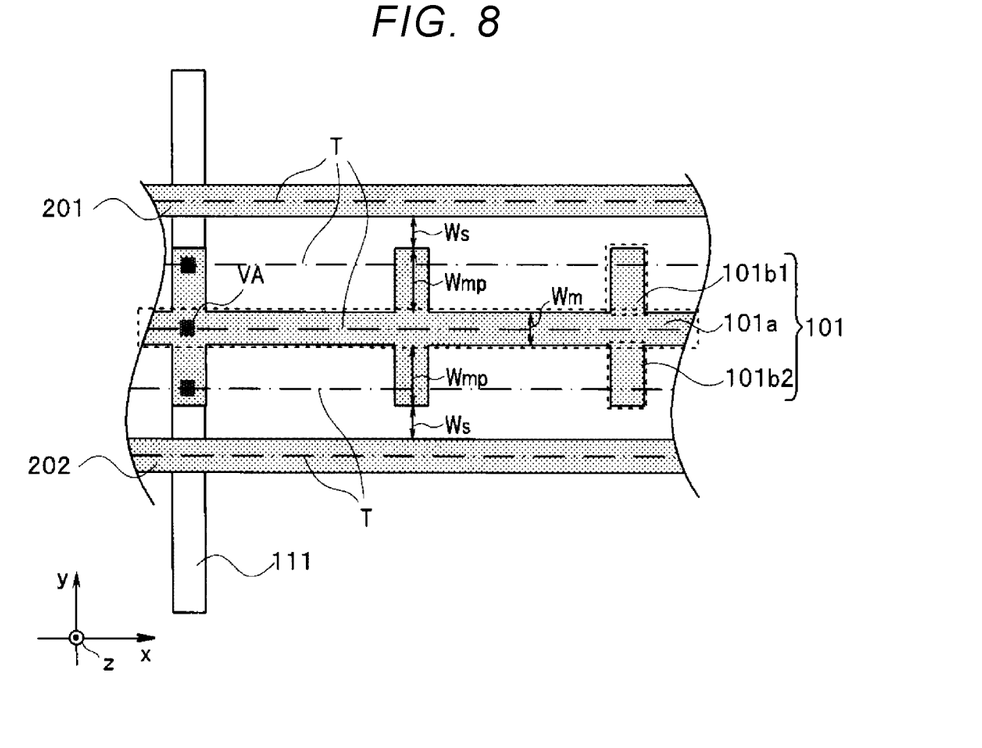
FIG. 8 is a schematic layout diagram of a wiring according to a second modification of the first embodiment.
Figure 9:
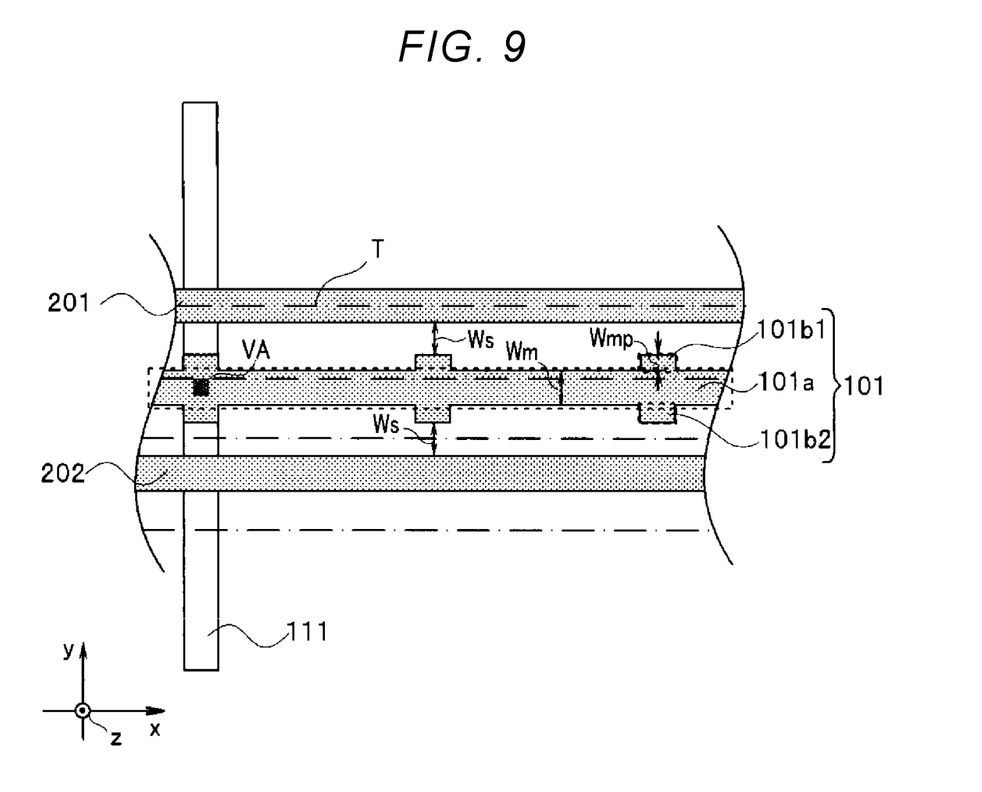
FIG. 9 is a schematic layout diagram of a wiring according to a third modification of the first embodiment.

Next, modifications of the first embodiment will be described with reference to FIGS. 7 to 9. FIGS. 7 to 9 are schematic layout diagrams of wirings according to the modifications of the first embodiment. The modification shown in FIG. 7 is different from the first embodiment described with reference to FIG. 6A in an arrangement of the branch wiring 101b in the signal line 101. That is, in the present modification, the branch wiring 101b extending in a direction (y direction) orthogonal to the extending direction (x direction) of the trunk wiring 101a is at any position of the trunk wiring 101a in only one of an upper direction in the y direction and a lower direction in the y direction. For example, as shown in FIG. 7, when viewed along the extending direction of the trunk wiring 101a, the branch wiring 101b1 extending in the +y direction and the branch wiring 101b2 extending in the −y direction are alternately arranged.

In this way, by reducing the number of the branch wiring 101b1 and 101b2 facing the signal lines 201 and 202 which are the noise sources, the crosstalk noise from the signal lines 201 and 202 to the signal line 101 can be further reduced.

The length of the branch wirings 101b1 and 101b2 can be changed in accordance with required characteristics or the like. In the modification shown in FIG. 8, the length Wmp of the branch wiring 101b in the signal line 101 is longer than that in the first embodiment described with reference to FIG. 6A. For example, as shown in FIG. 8, the length Wmp of the branch wirings 101b1 and 101b2 in the y direction is the same as the width of the wiring track T. As described above, by forming the branch wirings 101b1 and 101b2 long, the via VA can also be provided in the trunk wiring 101a, so that the number of vias VAs that connect the signal line 101 and the signal line 111 can be increased, and the connectivity between the wirings is improved. Further, the resistance to the damage caused by the antenna effect can be further improved.

In the modification shown in FIG. 9, the length Wmp of the branch wiring 101b in the signal line 101 is shorter than that in the first embodiment described with reference to FIG. 6A. For example, as shown in FIG. 9, the length Wmp of the branch wirings 101b1 and 101b2 in the y direction is ¼ of the width of the wiring track T. In this case, the three signal lines 101, 201, and 202 can be arranged using 3.5 wiring tracks T. In this way, by forming the branch wirings 101b1 and 101b2 short, the wiring area necessary for laying out the three signal lines 101, 201, and 202 can be reduced.

Second Embodiment

Next, a semiconductor storage device according to a second embodiment will be described. The semiconductor storage device of the embodiment is different from the semiconductor storage device of the first embodiment described above in that a plurality of signal lines 101 that are to be protected from the crosstalk noise are laid out in the wiring layer M2. The semiconductor storage device of the embodiment is also different from that of the first embodiment in that a plurality of signal lines 111 connected to the signal lines 101 disposed in the wiring layer M2 are laid out in the wiring layer M1. Hereinafter, only points different from the first embodiment will be described.

Figure 10:
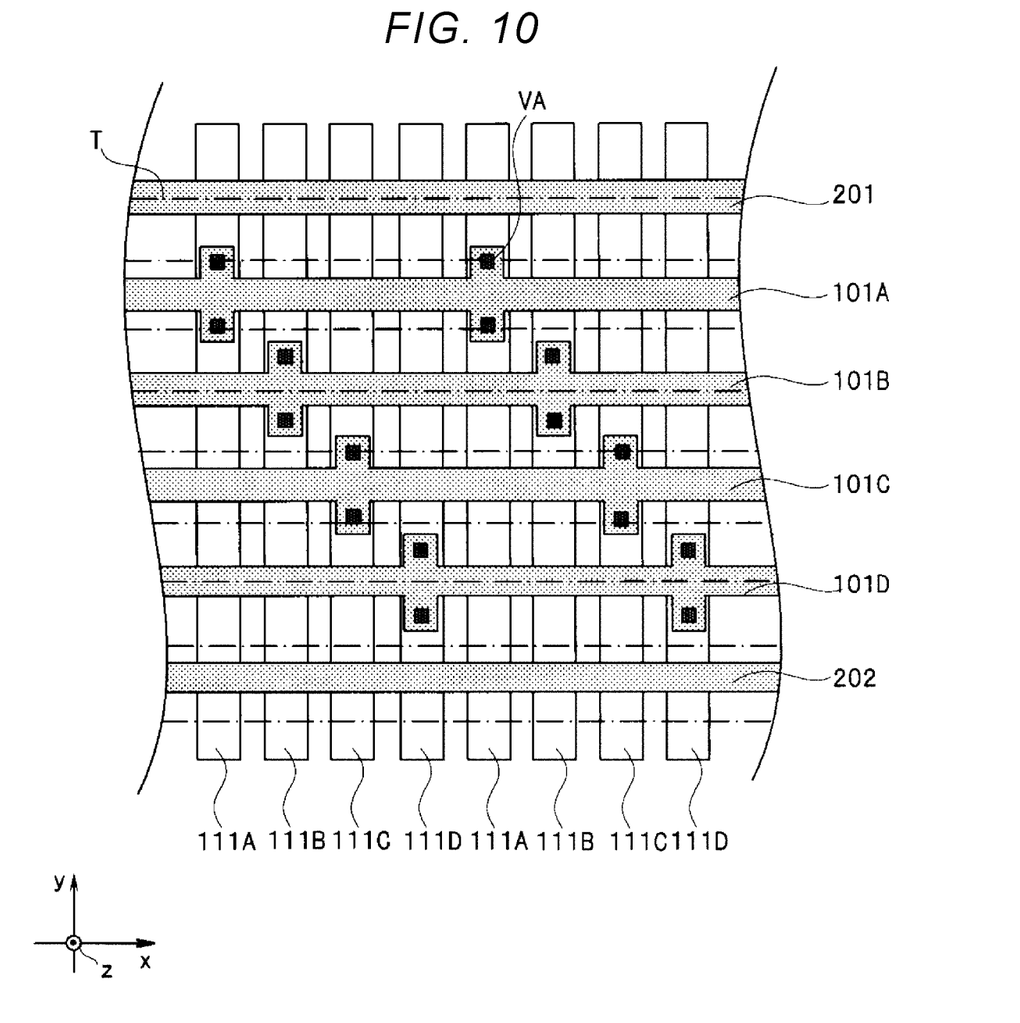
FIG. 10 is a schematic layout diagram of a wiring according to a second embodiment.

FIG. 10 is a schematic layout diagram of a wiring according to the second embodiment. As shown in FIG. 10, in the present embodiment, a plurality of signal lines 101A to 101D which are to be protected from the crosstalk noise are disposed between the signal lines 201 and 202 which are the noise sources. Each of the signal lines 101A to 101D has the same configuration as the signal line 101 described in the first embodiment. That is, the signal line includes a trunk wiring extending in the x direction and a branch wiring branched from the trunk wiring in the y direction. In the signal lines 101A to 101D, a position in the x direction in which the branch wiring is branched from the trunk wiring is different from one another. A distance between the trunk wiring of one signal line 101 and an end of the branch wiring of the signal line 101 disposed adjacently is Ws.

The signal line 101A is connected to the signal line 111A via a via VA disposed in the branch wiring. Similarly, the signal lines 101B, 101C, and 101D are also connected to the signal lines 111B, 111C, and 111D via vias VAs disposed in the respective branch wirings.

Figure 11:
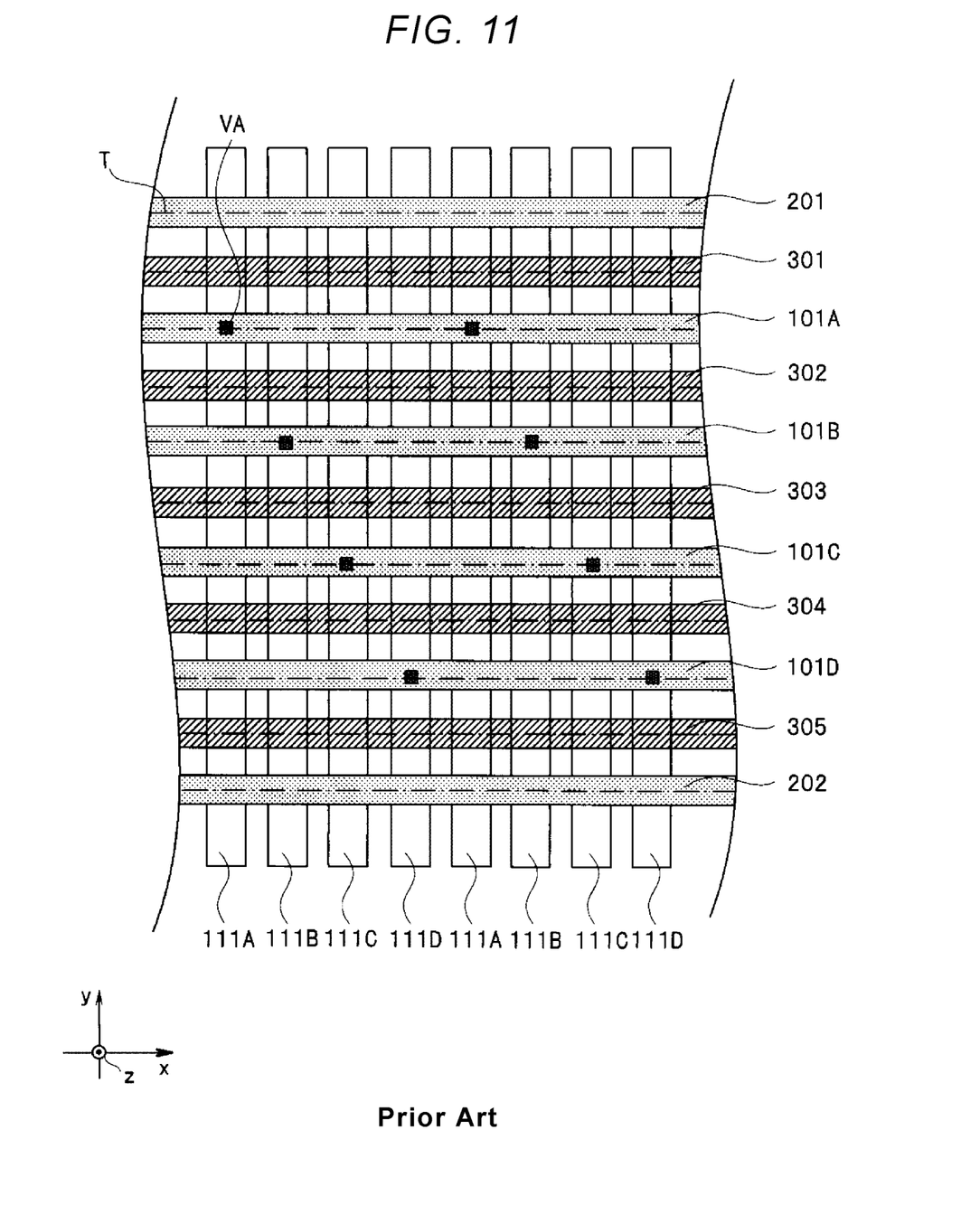
FIG. 11 is a schematic layout diagram of a wiring according to a comparative example.

FIG. 11 is a schematic layout diagram of a wiring according to a comparative example. FIG. 11 shows a layout when the crosstalk noise is prevented by using shield wirings 301 to 305 for six signal lines 101A to 101D, 201, and 202. In the case of FIG. 11, eleven wiring tracks T are required in order to arrange the six signal lines 101A to 101D, 201, and 202. On the other hand, in the embodiment shown in FIG. 10, when the length Wmp of the branch wiring is set to (Wm+Ws)/2 (half of the width of the wiring track T), the six signal lines 101A to 101D, 201, and 202 can be arranged using 8.5 wiring tracks T. Further, in the comparative example shown in FIG. 11, when the signal lines 101A to 101D and the signal lines 111A to 111D are connected by the vias VAs, respectively, only one via can be arranged in one x coordinate. On the other hand, in the embodiment shown in FIG. 10, a total of two branch wirings extend from one x coordinate position, that is, one extends upward in the y direction and one extends downward in the y direction from one x coordinate position, and vias VAs can be arranged in the branch wirings. Therefore, two vias can be arranged in the one x coordinate.

As described above, even when the plurality of signal lines 101A to 101D are disposed in the wiring layer M2, by providing the branch wiring on each signal line 101, a distance between the signal line and an adjacent signal line can be increased by the length of the branch wiring. Therefore, the crosstalk noise from the adjacent signal line can be reduced, and the increase in the wiring area can be prevented without using the shield wiring. In addition, since the via VA is provided in the branch wiring, the cross wiring disposed in another wiring layer can be connected by a plurality of vias VAs, so that the connectivity between the wirings is improved. Further, by connecting the wirings using a plurality of vias VAs, the resistance to the damage caused by the antenna can be improved.

Figure 12:
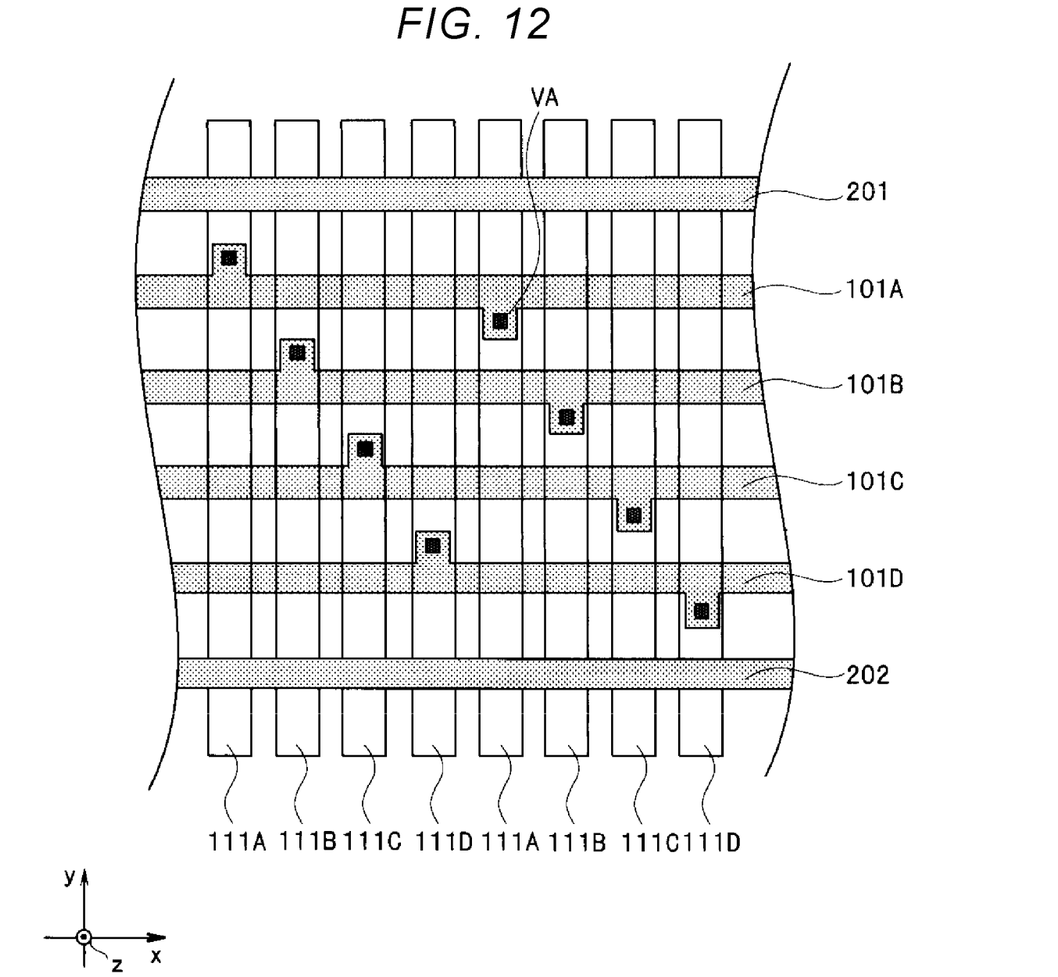
FIG. 12 is a schematic layout diagram of a wiring according to a modification of the second embodiment.

FIG. 12 is a schematic layout diagram of a wiring according to a modification of the second embodiment. In the present embodiment, similarly to the modification of the first embodiment, the branch wiring may also be laid out so as to branch in only one direction at any place of the trunk wiring. The length Wmp of the branch wiring can also be changed according to required characteristics or the like.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor storage device, comprising:
a first signal line extending in a first direction;
a second signal line extending in the first direction and adjacent to the first signal line in a second direction orthogonal to the first direction; and
a third signal line extending in the second direction in a second wiring layer different from a first wiring layer in which the first signal line is disposed, wherein
the first signal line includes:
a trunk wiring extending in the first direction that includes two branch wirings at a particular position of the trunk wiring, the two branch wirings including a first branch wiring extending from one side of the trunk wiring toward the second signal line in the second direction and a second branch wiring extending from another side of the trunk wiring in the second direction, wherein each of the first branch wiring and the second branch wiring includes a connection portion that electrically connects the first signal line and the third signal line.

2. The semiconductor storage device according to claim 1, wherein a distance between a first center line bisecting the trunk wiring of the first signal line in a width direction and a second center line bisecting the second signal line in the width direction is greater than a distance in the second direction between adjacent signal lines in the first wiring layer, by a length of one of the first and second branch wirings in the second direction.

3. The semiconductor storage device according to claim 2, wherein a length of one of the first and second branch wirings is one-half of the distance between the adjacent signal lines in the second direction.

4. The semiconductor storage device according to claim 2, wherein a length of one of the first and second branch wirings is one-fourth of the distance between the adjacent signal lines in the second direction.

5. The semiconductor storage device according to claim 1, wherein a distance between a first center line bisecting the trunk wiring of the first signal line in a width direction and a second center line bisecting the second signal line in the width direction is two times a distance in the second direction between adjacent signal lines in the first wiring layer.

6. The semiconductor storage device according to claim 1, wherein the first signal line includes, at a plurality of positions of the trunk wiring, a plurality of first branch wirings and a plurality of second branch wirings, each of the first branch wirings extending from the one side of the trunk wiring toward the second signal line in the second direction and not extending from the other side of the trunk wiring in the second direction, and each of the second branch wirings extending from the other side of the trunk wiring in the second direction and not extending from the one side of the trunk wiring in the second direction.

7. The semiconductor storage device according to claim 1, wherein a signal transmitted through the second signal line is a signal in which a voltage level fluctuates with time to generate crosstalk noise in a signal line adjacent thereto.

8. A semiconductor storage device, comprising:
a memory array;
a plurality of bit lines above the memory array in a first wiring layer;
a second wiring layer above the first wiring layer; and
a third wiring layer above the second wiring layer, wherein
the third wiring layer includes first and second signal lines extending in a first direction adjacent in a second direction orthogonal to the first direction,
the second wiring layer includes a third signal line extending in the second direction, and
the first signal line of the third wiring layer includes:
a trunk wiring extending in the first direction that includes two branch wirings at a particular position of the trunk wiring, the two branch wirings including a first branch wiring extending from one side of the trunk wiring toward the second signal line in the second direction and a second branch wiring extending from another side of the trunk wiring in the second direction, wherein each of the first branch wiring and the second branch wiring includes a connection portion that electrically connects the first signal line and the third signal line.

9. The semiconductor storage device according to claim 8, wherein a distance between a first center line bisecting the trunk wiring of the first signal line in a width direction and a second center line bisecting the second signal line in the width direction is greater than a distance in the second direction between adjacent signal lines in the third wiring layer, by a length of one of the first and second branch wirings in the second direction.

10. The semiconductor storage device according to claim 8, wherein the first signal line includes, at a plurality of positions of the trunk wiring, a plurality of first branch wirings and a plurality of second branch wirings, each of the first branch wirings extending from the one side of the trunk wiring toward the second signal line in the second direction and not extending from the other side of the trunk wiring in the second direction, and each of the second branch wirings extending from the other side of the trunk wiring in the second direction and not extending from the one side of the trunk wiring in the second direction.

11. The semiconductor storage device according to claim 8, wherein a signal transmitted through the second signal line is a signal in which a voltage level fluctuates with time to generate crosstalk noise in a signal line adjacent thereto.

* * * * *